United States Patent
Park

(10) Patent No.: US 8,343,784 B2
(45) Date of Patent: Jan. 1, 2013

(54) LIGHT EMITTING DIODE DEVICE, MANUFACTURING METHOD OF THE LIGHT EMITTING DIODE DEVICE AND MOUNTING STRUCTURE OF THE LIGHT EMITTING DIODE DEVICE

(75) Inventor: Dong Wook Park, Gwangju (KR)

(73) Assignee: LG Innotek Co., Ltd., Seoul (KR)

(*) Notice: Subject to any disclaimer, the term of this patent is extended or adjusted under 35 U.S.C. 154(b) by 1101 days.

(21) Appl. No.: 11/586,648

(22) Filed: Oct. 26, 2006

(65) Prior Publication Data

US 2007/0099325 A1 May 3, 2007

(30) Foreign Application Priority Data

Oct. 27, 2005 (KR) .................... 10-2005-0101771

(51) Int. Cl.
*H01L 21/00* (2006.01)
(52) U.S. Cl. .................. 438/29; 438/25; 257/E25.028
(58) Field of Classification Search ............ 438/25–28; 257/E25.008

See application file for complete search history.

(56) References Cited

U.S. PATENT DOCUMENTS

| 5,587,342 A * | 12/1996 | Lin et al. ................. 438/125 |
| 6,019,932 A * | 2/2000 | Kambara ................... 264/510 |
| 6,531,328 B1 * | 3/2003 | Chen ........................ 438/26 |
| 2001/0040287 A1 * | 11/2001 | Hosomi ..................... 257/693 |
| 2002/0008325 A1 | 1/2002 | Tominaga |
| 2005/0146879 A1 | 7/2005 | Takahashi et al. |
| 2005/0211992 A1 | 9/2005 | Nomura et al. |
| 2006/0208271 A1 * | 9/2006 | Kim et al. .................. 257/100 |
| 2007/0007540 A1 | 1/2007 | Hashimoto et al. |

FOREIGN PATENT DOCUMENTS

| JP | 6-120229 A | 4/1994 |
| JP | 2000-349347 A | 12/2000 |
| JP | 2001-345482 A | 12/2001 |
| JP | 2002-33410 A | 1/2002 |
| JP | 2003-152018 A | 5/2003 |
| JP | 2005-12155 A | 1/2005 |
| JP | 2005-44865 A | 2/2005 |
| JP | 2005-123588 A | 5/2005 |
| JP | 2005-158957 A | 6/2005 |
| JP | 2005-285925 A | 10/2005 |
| KR | 10-2004-0021951 A | 3/2004 |

* cited by examiner

*Primary Examiner* — Matthew Reames
(74) *Attorney, Agent, or Firm* — Birch, Stewart, Kolasch & Birch, LLP

(57) ABSTRACT

The embodiment of the present invention provides an LED device, a manufacturing method of the LED device and a mounting structure of the LED device. In order to manufacture the LED device with low manufacturing cost through simple process capable of overcoming thermal fatigue due to heat generation, breaking of wire due to mechanical stress, the method comprises etching a wafer; forming a conductive metal layer from an upper surface to a lower surface of the wafer; bonding a light emitting diode chip to the metal layer which is disposed on the upper surface of the wafer; filling a resin into a space over the light emitting diode chip; and forming an electrode pad on the metal layer which is disposed on the lower surface of the wafer.

19 Claims, 4 Drawing Sheets

LIGHT EMITTING DIODE DEVICE, MANUFACTURING METHOD OF THE LIGHT EMITTING DIODE DEVICE AND MOUNTING STRUCTURE OF THE LIGHT EMITTING DIODE DEVICE

BACKGROUND OF THE INVENTION

1. Field of the Invention

The present invention relates to a light emitting diode (LED) device and a manufacturing method of the LED device and a mounting structure of the LED device.

2. Description of the Related Art

A related art light emitting diode (LED) device, as illustrated in FIG. 1, is embodied by loading respective LED chips corresponding to red, green and blue LEDs 2, 3 and 4 into one independent package, and mounting it on a circuit substrate 1. Here, in the LED device, the LED chips are respectively modularized by molding epoxy resin in the shape of a lens.

However, the related art LED device is manufactured through a complicated and tedious process. That is, the chip is manufactured in a single package type in advance, and it is then bonded to a printed circuit board (PCB), which makes the manufacturing cost increased inevitably. Above all, in terms of heat release which is the most important factor for high power (high brightness) applications, since a main path of the heat release from the LED generating heat to an external environment is a structural connection portion between a metallic lead frame and a PCB metallic portion inside the single package, the heat release path of a single package-shaped module is limited to only a few elements and the length of the heat release path is too long so that heat release rate becomes low in spite of high manufacturing cost.

Another related art LED device has a chip on board (COB) structured one in which the LED chip is flip-bonded to a submount of a silicon optical bench (SIOB) or directly die-bonded to the PCB, and it is then electrically connected by wire bonding.

The COB structure somewhat improves shortcomings of the single package-shaped module. That is, the COB structure provides several advantages such as simple process, low manufacturing cost, short heat release path or the like in comparison with the related art. However, the COB structure can be obtained through the wire bonding and the die bonding so that there is still disadvantages such as thermal fatigue due to the heat generated from the LED, breaking of wire due to mechanical stress, or the like. These disadvantages are immediate problems to be urgently overcome considering that an LED market is branching out into high power applications.

In addition, there is a drawback that it is difficult to reuse defectives produced in the COB modularization process.

SUMMARY OF THE INVENTION

Accordingly, the present invention is related to a light emitting diode (LED) device, a manufacturing method of the LED device and a mounting structure of the LED device that substantially obviate one or more problems due to limitations and disadvantages of the related art.

The present invention provides an LED device capable of overcoming disadvantages of the related art modularization technique such as complicated and tedious process, high manufacturing cost, thermal reliability problem, or the like, a manufacturing method of the LED device and a mounting structure of the LED device.

The present invention provides an LED device with enhanced soderability capable of preventing damage occurring in manufacture, distribution and use of the LED device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiment of the invention provides a method for manufacturing a light emitting diode, the method comprising: etching a wafer; forming a conductive metal layer from an upper surface to a lower surface of the wafer; bonding a light emitting diode chip to the metal layer which is disposed on the upper surface of the wafer; filling a resin into a space over the light emitting diode chip; and forming an electrode pad on the metal layer which is disposed on the lower surface of the wafer.

The embodiment of the present invention provides a light emitting diode device comprising: a wafer; a concavity formed by recessing an upper surface of the wafer; at least one pair of metal layers extended from the concavity to a lower surface of the wafer; at least one light emitting diode chip in contact with the metal layer in the concavity; a filling part formed by filling a resin into the concavity; and an electrode pad in contact with the metal layer extended to the lower surface of the wafer.

The embodiment of the present invention provides a mounting structure of a light emitting diode device comprising: a substrate in which a conductive pattern is formed; a light emitting diode device in which an electrode pad is formed on a lower surface thereof; and a solder disposed on a connection portion between the conductive pattern and the electrode pad, enabling a power of the substrate to be applied to the light emitting diode device, wherein the electrode pad is formed by coating a paste with a squeeze under the state that a screen mask is disposed on the lower surface of the light emitting diode device, and subsequently curing the coated paste.

According to the present invention, it is possible to realize advantages such as low manufacturing cost, simple process, etc. In addition, it is possible to remove a thermal fatigue due to heat generation and breaking of wire due to mechanical stress in the LED device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

It will be understood that when an element is referred to as being 'on' a layer, it can be directly on the layer, and one or more intervening layers may also be present.

FIGS. 2 to 8 are schematic views illustrating a method of an LED device according to the present invention.

Figure 1:
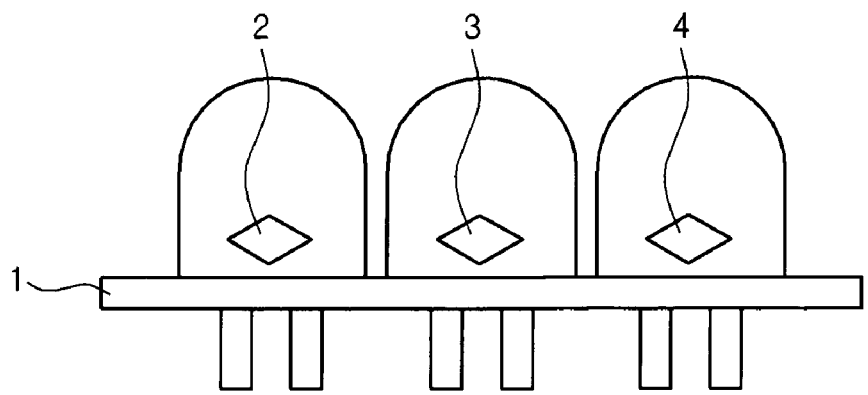
FIG. 1 is a schematic view of a related art light emitting diode (LED) module.
Figure 2:
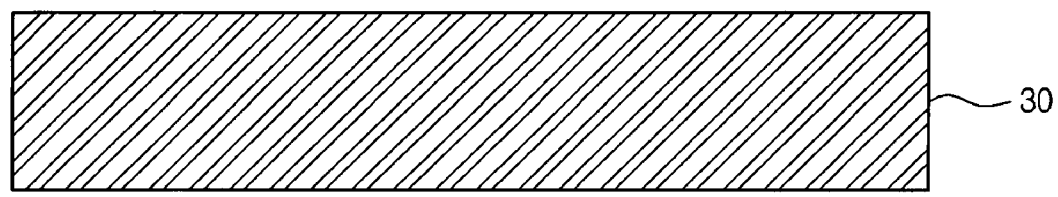
FIGS. 2 to 8 are plane view and sectional views illustrating a method of an LED device according to the present invention.

First, a wafer 30 of FIG. 2 is processed into a predetermined shape by photo-lithography and etching. It is preferable that the wafer 30 is a silicon wafer.

Figure 3:
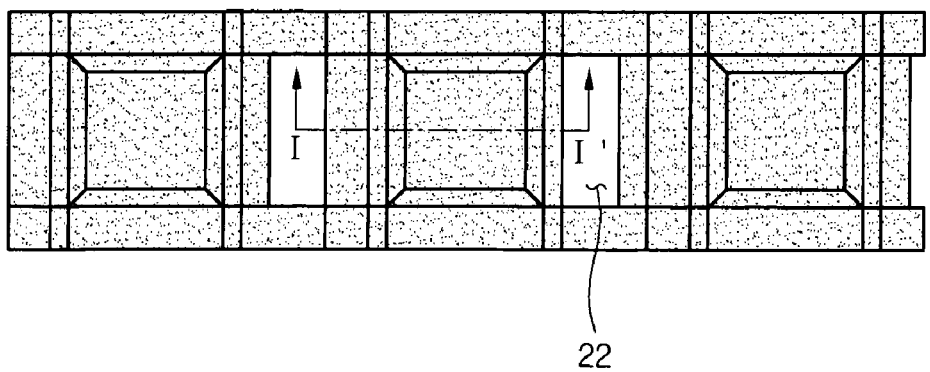
Figure 4:
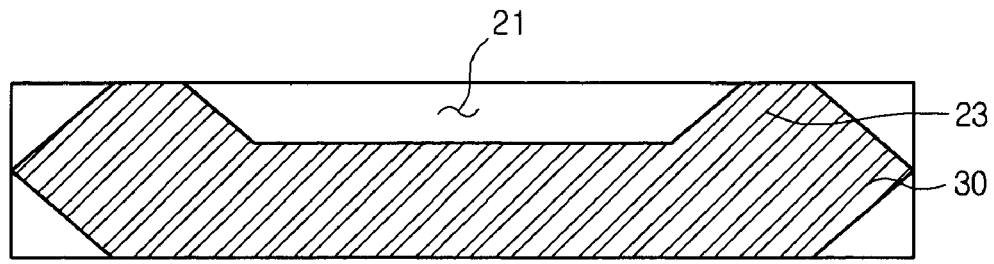
Figure 5:
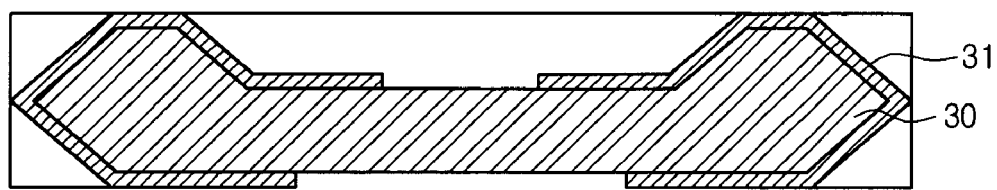

FIG. 3 is a plane view of the processed wafer, and FIG. 4 is a sectional view taken along line I-I' of FIG. 3. Referring to FIGS. 3 and 4, the shape of the processed wafer may be easily understood. In detail, a concavity 21 is formed with a predetermined depth and length in the wafer 30 by recessing an upper surface of the wafer flatly. Outside the concavity 21, there is formed a protrusion 23 which is upwardly protruded in comparison with the concavity 21. In addition, the concavity 21 and the protrusion 23 are formed in a set and plurality of sets are formed on the single wafer 30. In order to easily detach the respective sets after finishing the process and attach upper and lower electrodes thereon, a hole 22 is formed between the sets.

An etching process for making the wafer have the shape of FIGS. 3 and 4 is performed by wet etching, e.g., anisotropic wet-etching process, wherein potassium hydroxide (KOH) may be used as etching solution of anisotropic wet-etching process. The KOH etching solution has excellent properties such as rapid etching rate, low price, good crystallographic orientation dependence, or the like, in comparison with another anisotropic wet-etching solution. A silicon dioxide is used as a mask.

Subsequently, the wafer of FIGS. 3 and 4 is mounted in a chamber with high vacuum state ($5 \times 10^{-5} \sim 5 \times 10^{-7}$ torr), and a metal layer 31 having conductivity, e.g., Al, Au, Cu, is deposited on the wafer 30 by deposition technique using e-beam. There is illustrated the wafer where the metal layer 31 is deposited in FIG. 5. In detail, the metal layer 31 is deposited on one surface of the wafer 30 for a predetermined period such that it has a thickness in range of 1 to 2 μm, and thereafter the metal layer 31 is deposited on the other surface of the wafer 30 similarly. The metal layer 31 is formed such that it is extended from the concavity 21 to a lower surface of the wafer 30 through the hole 22.

Figure 6:
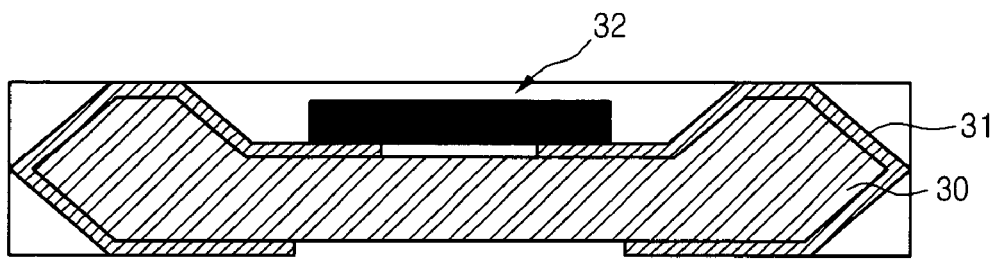

After depositing the metal layer 31 on the wafer 30, as illustrated in FIG. 6, the LED chip 32 is flip-bonded to the metal layer 31 using a gold (Au) stud (not shown) formed under the LED chip 32. At this time, the LED chip 32 is electrically connected to the metal layer 31 under the state that it is disposed inside the concavity 21. In addition, a pair of the metal layers 31 are respectively in contact with the LED chip 32 so that external power can be applied to the LED chip 32 therethrough.

Since the lead frame is not required when using the flip-bonding technique, a total size may be reduced so that it is beneficial to miniaturization and lightweight. Input/output terminals are disposed on a base plate so that the LED has more excellent electrical property than the related art wire type package.

After the flip-bonding of the LED chip 32 on the metal layer 31, an inner space of the concavity 21 in which the LED chip 32 is disposed is filled with a resin to thereby form a filling part 33, wherein an upper surface of the filling part 33 is planarized.

A method of forming the filling part 33 will be illustrated in detail. The filling part 33 may be simply formed using a screen printing method instead of a pneumatic system such as a dispensing system. The screen printing method has an advantage that it is possible to coat a coating material on a wider area than the pneumatic dispensing system in a short time, and an equipment investment cost is low.

Figure 9:
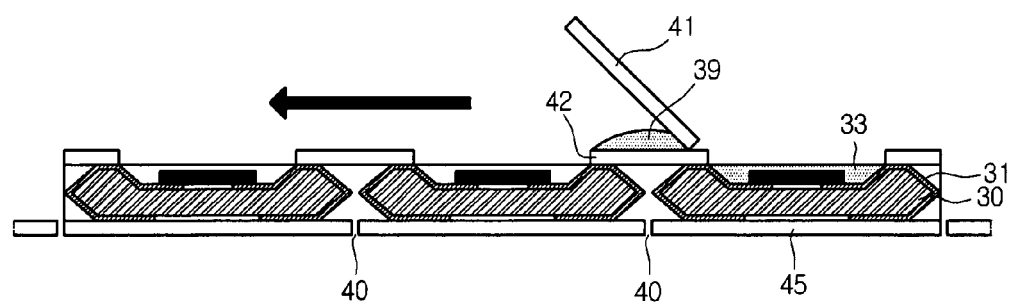
FIG. 9 is a schematic view illustrating a process of forming a filling part according to the present invention.

The screen printing method will be illustrated in detail with reference to FIG. 9. A screen mask 42 is disposed on the upper surface of the wafer 30, wherein the thickness of the screen mask 42, for example, is 50 μm. The wafer 30 is mounted on a wafer chuck 45, and air is sucked through apertures 40 using a vacuum pump. Thus, the screen mask 42 is compressively fixed. Thereafter, a resin 39 fills a space between respective screen masks 42 using a squeeze 41 so as to form the filling part 33. Specifically, the squeeze 41 works in manner that it rubs the fluidal resin 39 while it moves in a predetermined direction along the upper surface of the screen mask 42. Thus, the fluidal resin 39 fills the space between the respective screen masks 42, i.e., the inner space of the concavity 21.

Herein, the resin may be formed in which fluorescent substance is mixed at predetermined molar ratio. It is possible to embody a variety of light-emitting colors according to a kind of fluorescent substance, resin, and mixed molar ratio. For instance, it may use garnet series or silicate series fluorescent substance.

After filling the fluidal resin 39 into the concavity 21, the resin 39 is heated at a preset temperature so that the resin 39 is cured, and it is then planarized until the upper surface of the resin 39 is identical in height to the upper surface of the wafer 30.

After forming the filling part 33, an electrode is formed on the lower surface of the wafer 30.

Figure 7:
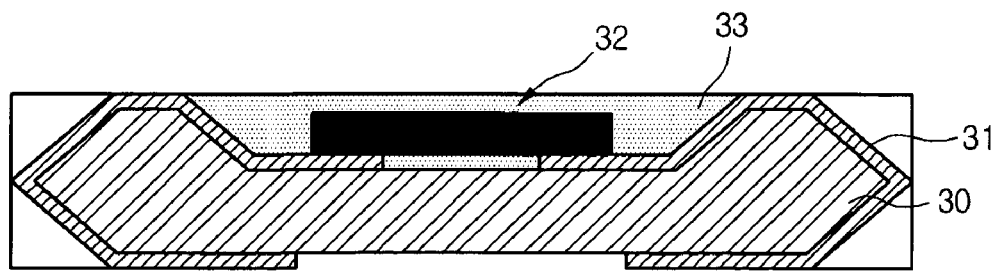
Figure 10:
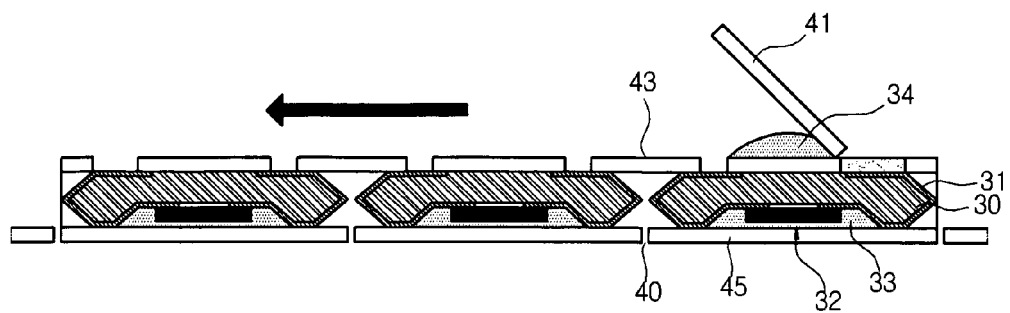
FIG. 10 is a sectional view illustrating a process of forming an electrode pad according to the present invention.

In detail, referring to FIG. 10, the wafer shown in FIG. 7 is turned upside down, and the upper surface of the wafer 30 is mounted on the wafer chuck 45. A screen mask 43 is formed on the lower surface of the wafer 30 in order to coat a paste 34 for forming an electrode pad 35.

The reason the electrode pad 35 is formed using the paste 34 is to form the electrode pad with a predetermined thickness greater than several tens of micrometers. That is, in consideration of adhesive property between a reflow solder, e.g., solder, and the electrode pad 35, if forming a metal pad by deposition method, it is difficult to expect sufficient hardness and adhesive property because it is difficult to form the electrode pad 35 with a thickness of several micrometers or greater. Therefore, in order to form the electrode pad with a predetermined thickness greater than several tens of micrometers in a short time, the electrode pad 35 is formed using the paste 34 having electrical conductivity. By using the paste 34, it is possible to overcome the problem with regard to the adhesive property of the pad, and electrical stability can be expected as well.

After disposing the screen mask 43, an air is sucked using the vacuum pump coupled to apertures 40 of the wafer chuck 45 so that the screen mask 43 is compressively fixed. Afterwards, the paste 34 is filled into a space between the screen masks 43. In detail, the squeeze 41 works in manner that it rubs the fluidal resin 39 while it moves in a predetermined direction along the upper surface of the screen mask 42. By using the squeeze 41, the reliability of the LED device is improved because the work speed is extremely enhanced and the paste 34 is .13 uniformly filled.

Figure 8:
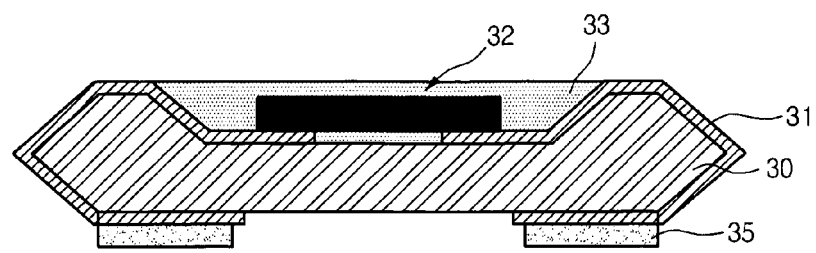

After filling the liquid paste 34 into the space between the screen masks 43, the paste 34 is heated at the preset temperature so that the paste 34 is cured. Thereafter, the surface of the cured paste 34 is planarized. Subsequently, the screen mask 43 is removed to thereby embody the electrode pad 35 as illustrated in FIG. 8.

Figure 11:
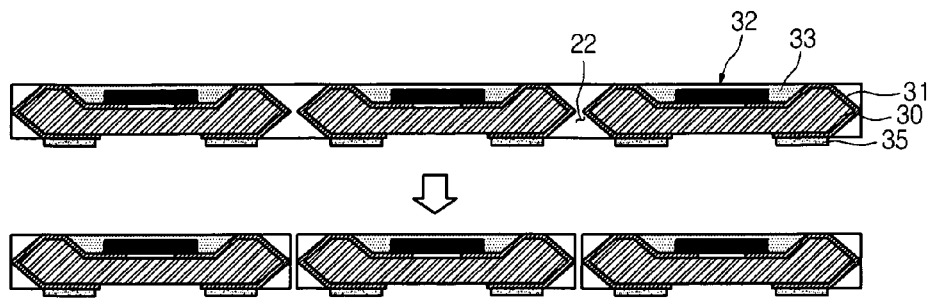
FIG. 11 is a sectional view illustrating a process of completing respective LED devices by cutting a wafer in which a product is formed, after forming the electrode pad, according to the present invention.

After processing the wafer 30, a sawing operation is performed as illustrated in FIG. 11 so as to manufacture the LED device. Since the wafer is cut along the holes 22, any of the LED devices is not damaged. Particularly, there is an advantageous merit that the metal layer 31 is safely protected.

According to the inventive method, since a plurality of LED devices can be fabricated through processing procedure of a single wafer, the manufacturing cost of the LED can be reduced. Furthermore, the electrode pad 35 and the filling part 33 can be formed over a wide area so as to more reduce the manufacturing cost.

In addition, because the LED chip is directly packaged at wafer level, there is an advantage that the manufacturing process of the LED device is simplified.

Since the LED chip is stably disposed in the LED device and the electrode is formed firmly, it is firmly supported against external impact so that the reliability of the product is increased.

The LED device is mounted on the substrate finally. In detail, the LED device according to the present invention may be attached to a PCB land, which is a conductive pattern of metallic material, in a PCB 62 using a reflow solder 60. Thus, since the LED device can be surface-mounted onto the substrate itself by the exemplified method such as the reflow method, it is convenient to mount the LED device. According to the mounting structure of the LED device, a power is applied to the LED chip 32 through the PCB land 61, the electrode pad 35 and the metal layer 31 sequentially when the power is applied to the substrate. Therefore, the LED chip 32 to which the power is applied emits light.

Figure 12:
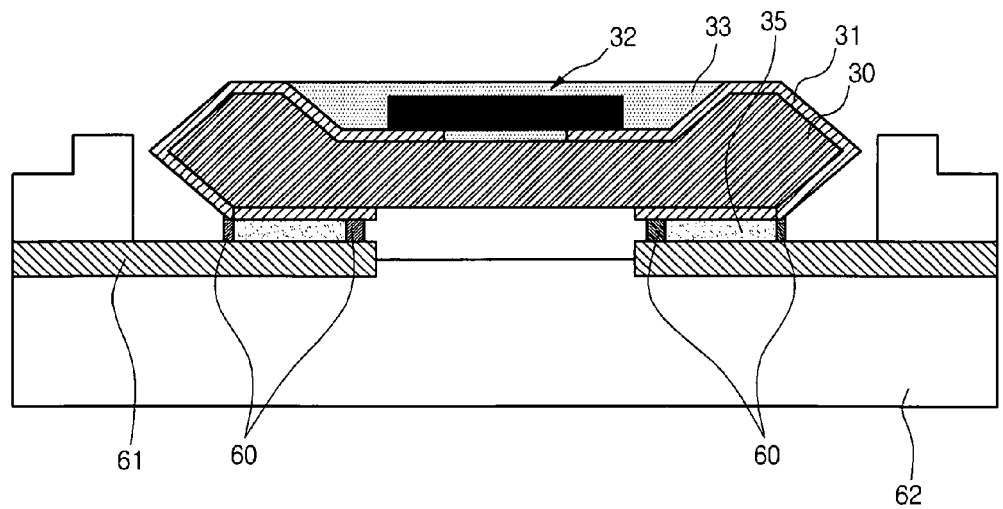
FIG. 12 is a sectional view illustrating a mounting structure of the LED according to the present invention.

Besides the PCB of FIG. 12, the LED device according to the present invention may be attached to a metal PCB, a double-sided PCB, etc, for high power application using copper, aluminum, etc, so that it may be applied to a chip on board (COB) structure.

In the present invention, a pad is formed using conductive paste and the electrode is extended to a lower surface of the wafer so that it is possible to embody the package of wafer level. Therefore, the LED device can be manufactured with low cost and simple process.

According to the inventive LED device, it is possible to overcome thermal fatigue due to heat generation and breaking of wire due to mechanical stress.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a light emitting diode, the method comprising:
   forming a concavity in an upper portion of a wafer body;
   forming a plurality of metal layers on a surface of the wafer body, each of the plurality of metal layers having
      a portion disposed on a bottom surface of the concavity,
      a portion disposed on a top surface of the wafer body, and
      a portion disposed on a lower surface of the wafer body, the plurality of metal layers being spaced apart from each other;
   flip-bonding a light emitting diode chip on the portions of the plurality of metal layers disposed on the bottom surface of the concavity so that the light emitting diode chip is electrically connected to each of the plurality of metal layers;
   filling a resin in the concavity to cover the light emitting diode chip; and
   forming a plurality of electrode pads respectively under the portions of the plurality of metal layers disposed on the bottom surface of the wafer body so that the plurality of electrode pads are electrically connected to the light emitting diode chip,
   wherein a top surface of the resin is formed on a same plane as a top surface of the portions of the plurality of metal layers disposed on the top surface of the wafer body,
   wherein the plurality of electrode pads each have a thickness thicker than a thickness of each of the plurality of metal layers, and
   wherein the thickness the plurality of electrode pads is greater than 10 micrometers.

2. The method according to claim 1, wherein the wafer body has opposing outer portions that each include
   respective portions of the top surface of the wafer body,
   respective portions of the bottom surface of the wafer body,
   a first surface that slopes down from the respective top surface of the wafer body toward a respective outer edge of the wafer body, and
   a second surface that slopes down from the respective top surface of the wafer body toward the bottom surface of the concavity.

3. The method according to claim 1,
   wherein the resin includes a fluorescent substance, and
   wherein a portion of the resin is disposed between the light emitting diode chip and the bottom surface of the concavity.

4. The method according to claim 2, wherein the plurality of metal layers are disposed on the opposing outer portions of the wafer body, respectively.

5. The method according to claim 2, wherein the concavity and the opposing outer portions of the wafer body comprise opposing sloped sides.

6. The method according to claim 2, wherein the wafer body is formed of a silicon material.

7. The method according to claim 1, wherein a thickness of the conductive metal layer is in a range of 1 to 2 μm.

8. The method according to claim 2,
   wherein the resin is formed by squeezing a fluidal resin into the concavity using a resin squeeze, and
   wherein the forming the plurality of electrode pads includes squeezing a paste under respective regions of the portions of the plurality of metal layers disposed on the bottom surface of the wafer body using a paste squeeze.

9. The method according to claim 6, wherein the forming the plurality of electrode pads includes squeezing a paste under the portions of the plurality of metal layers disposed on the bottom surface of the wafer body using a squeeze.

10. The method according to claim 1, wherein each of the plurality of electrode pads has a flat lower surface.

11. The method according to claim 10, wherein a top surface of the resin has a planar surface.

12. A method for manufacturing a light emitting diode, the method comprising:
forming a concavity in an upper portion of a wafer body of a silicon material;
forming a plurality of metal layers on a surface of the wafer body, each of the plurality of metal layers including
a first region on a bottom surface of the concavity,
a second region on a top surface of the wafer body, and
a third region on a lower surface of the wafer body;
flip-bonding a light emitting diode chip on the respective first regions of the plurality of metal layers so that the light emitting diode chip is electrically connected to each of the plurality of metal layers;
forming a resin in the concavity to cover the light emitting diode chip; and
forming a plurality of electrode pads respectively under the third regions of the plurality of metal layers so that the plurality of electrode pads are electrically connected to the light emitting diode chip,
wherein each of the plurality of electrode pads have a thickness thicker than a thickness of each of the plurality of metal layers,
wherein each of the electrode pads has a width smaller than a width of each of the third regions of the plurality of metal layers,
wherein the plurality of electrode pads have a flat lower surface,
wherein a top surface of the resin is formed on the same plane as a top surface of the second regions of the plurality of metal layers, and wherein the resin and the plurality of electrode pads are formed by squeezing corresponding material with one or more squeezes.

13. The method according to claim 12, wherein the top surface of the resin is formed in a flat surface.

14. The method according to claim 12, wherein the thickness of each of the plurality of electrode pads is greater than 10 micrometers.

15. The method according to claim 13,
wherein the resin is formed by squeezing a fluidal resin into the concavity using a resin squeeze, and
wherein a portion of the resin is disposed between the light emitting diode chip and the bottom surface of the concavity.

16. The method according to claim 14, wherein the forming of the plurality of electrode pads comprises:
mounting a screen mask having a plurality of holes under each of the third regions of the plurality of metal layers and the lower surface of the wafer body;
squeezing a paste into the plurality of holes using a paste squeeze.

17. The method according to claim 12, wherein the wafer body comprises:
opposing first surfaces that slope down from respective portions of the top surface of the wafer body toward an outer edge of the wafer body, and
opposing second surfaces that slope down from the respective portions of the top surface of the wafer body toward the bottom surface of the concavity.

18. The method according to claim 17, wherein each of the plurality of metal layers are disposed on respective ones of the opposing first surfaces and the opposing second surfaces of the outer portions of the wafer body.

19. The method according to claim 17, wherein the resin includes a fluorescent substance therein.

* * * * *